(12) United States Patent
Park et al.

(10) Patent No.: US 8,907,324 B2
(45) Date of Patent: Dec. 9, 2014

(54) ORGANIC LIGHT EMITTING DISPLAY DEVICE HAVING SOLAR CELL POLARIZING FILM

(75) Inventors: Hyehyang Park, Yongin-si (KR); Byoungdeog Choi, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1636 days.

(21) Appl. No.: 11/826,022

(22) Filed: Jul. 11, 2007

(65) Prior Publication Data

US 2008/0163923 A1    Jul. 10, 2008

(30) Foreign Application Priority Data

Jan. 8, 2007 (KR) .......... 10-2007-0002111

(51) Int. Cl.
| | |
|---|---|
| *H01L 33/00* | (2010.01) |
| *H01L 27/32* | (2006.01) |
| *H01G 9/20* | (2006.01) |
| *H01L 51/42* | (2006.01) |

(52) U.S. Cl.
CPC .......... *H01G 9/2031* (2013.01); *Y02E 10/542* (2013.01); *H01L 51/4226* (2013.01); *H01L 27/3227* (2013.01); *H01L 27/3244* (2013.01)
USPC ............................................. 257/40; 257/80

(58) Field of Classification Search
USPC ................ 257/E33.001, 290, 291, 40, 79–80; 136/248
See application file for complete search history.

(56) References Cited

U.S. PATENT DOCUMENTS

| | | | | |
|---|---|---|---|---|
| 4,328,456 A | * | 5/1982 | Suzuki et al. ................. | 320/101 |
| 6,324,329 B1 | * | 11/2001 | Mizuno ......................... | 385/131 |
| 6,670,597 B1 | * | 12/2003 | Kitamura et al. ....... | 250/214 AL |
| 2002/0197474 A1 | * | 12/2002 | Reynolds ..................... | 428/398 |
| 2003/0013008 A1 | * | 1/2003 | Ono .............................. | 429/111 |
| 2005/0183764 A1 | * | 8/2005 | Han et al. ..................... | 136/251 |
| 2007/0034254 A1 | * | 2/2007 | Miyoshi ....................... | 136/263 |

FOREIGN PATENT DOCUMENTS

| | | | | |
|---|---|---|---|---|
| JP | 2003272724 A | * | 9/2003 | ............ H01M 14/00 |
| KR | 1020050083243 A | | 8/2005 | |

* cited by examiner

*Primary Examiner* — Cuong Q Nguyen
(74) *Attorney, Agent, or Firm* — Robert E. Bushnell, Esq.

(57) ABSTRACT

An organic light emitting display not only display images but also generates power by employing a dye-sensitized solar cell as a polarizing film of the organic light emitting display. The organic light emitting display includes: a substrate; an Organic Light Emitting Diode (OLED) including an anode arranged on an upper surface of the substrate, an organic thin film arranged on an upper surface of the anode, and a cathode arranged on an upper surface of the organic thin film; and a solar cell layer arranged on an upper surface of the cathode.

21 Claims, 5 Drawing Sheets

FIG. 9

ORGANIC LIGHT EMITTING DISPLAY DEVICE HAVING SOLAR CELL POLARIZING FILM

CLAIM OF PRIORITY

This application makes reference to, incorporates the same herein, and claims all benefits accruing under 35 U.S.C. §119 from an application for ORGANIC LIGHT EMITTING DISPLAY HAVING SOLAR CELL POLARIZING FILM earlier filed in the Korean Intellectual Property Office on 8 Jan. 2007 and there duly assigned Serial No. 10-2007-0002111.

BACKGROUND OF THE INVENTION

1. Field of the Invention

The present invention relates to an organic light emitting display, and more specifically, the present invention relates to an organic light emitting display with embedded a dye-sensitized solar cell that not only displays images but also generates power by employing a dye-sensitized solar cell as a polarizing film of the organic light emitting display, the dye-sensitized solar cell having been developed to have a reasonable price and high energy efficiency using organic dyes and Nano-Technology (NT).

2. Description of the Related Art

Organic light emitting displays have been popular as variously-sized moving image displays because of their wide viewing angle, high-speed response, self-emission and the like. Organic light emitting displays also have lower power consumption and can be made thinner and lighter because a backlight is not required. Moreover, organic light emitting displays can be manufactured at a lower temperature and at a lower cost because of their simple fabrication process. Recently, with rapid development of organic thin film materials and process technology, organic light emitting displays have been considered as displays that can replace existing flat panel displays.

Portable devices, such as notebook computers, PDAs, cell-phones and the like, which may include an organic light emitting display, use a battery to supply power. The battery life is very restrictive, so that it becomes very important and critical as to how to supply power to the portable device while moving.

In general, an organic light emitting display causes self-emission by supplying current to a fluorescent material or phosphor to combine electrons with holes.

Organic light emitting displays can be classified into a voltage programming organic light emitting displays and a current programming organic light emitting displays according to the type of data to be written into a data line.

Figure 1:
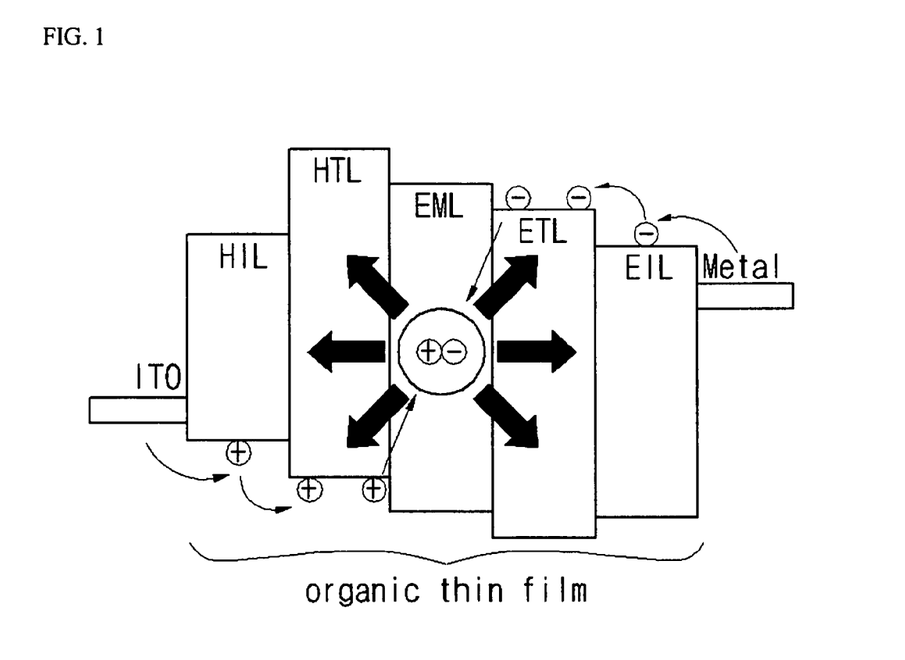
FIG. 1 is a schematic view of an OLED.

Referring to FIG. 1, an Organic Light Emitting Diode (OLED) includes an anode of Indium Tin Oxide (ITO), an organic thin film, and a cathode (metal) in its basic structure.

The organic thin film may include an EMission Layer (EML) for generating excitons with the combination of electrons and holes to emit light, an Electron Injection Layer (EIL) for injecting electrons, and a Hole Injection Layer (HIL) for injecting holes. To improve the efficiency of the OLED, the thin film may further include an Electron Transporting Layer (ETL) for transporting electrons, and a Hole Transporting Layer (HTL) for transporting holes. A phosphor-based OLED may further include a Hole Blocking Layer (HBL) for blocking holes from flowing. The HBL is typically disposed between electron transportation layers. However, an HBL is an optional component of an OLED.

Conventionally, methods for lengthening the battery life of portable devices have focused on various algorithms for saving power or power saving circuits. Nevertheless, users has been still troubled with restrictive battery life in that a battery has limitations in saving electrical power.

Furthermore, a recent trend, in which electronics such as PDAs, laptop computers, monitors, TVs, and the like are made thinner in depth, and thus slimmer, greatly restricts the thickness of battery used therein.

Battery capacity is more critical for notebook computers or PDAs that need to be turned on for a long time.

SUMMARY OF THE INVENTION

Accordingly, the present invention has been made to solve the above-mentioned problems occurring in the prior art, and an object of the present invention is to provide an organic light emitting display that can not only display images but also generates power by employing a dye-sensitized solar cell as a polarizing film of the organic light emitting display, the dye-sensitized solar cell having been developed to have a high energy efficiency using organic dyes and Nano-Technology (NT). For this purpose, a dye-sensitized solar cell is applied to the polarizing layer of the organic light emitting display in order to generate power, so that the generated power may be used as an energy source for charging the battery for a portable device and thus prolong battery life of the portable device.

According to one aspect of the present invention, an organic light emitting display includes a substrate; an Organic Light Emitting Diode (OLED) including an anode formed on an upper surface of the substrate, an organic thin film formed on an upper surface of the anode, and a cathode formed on an upper surface of the organic thin film; and a solar cell layer formed on an upper surface of the cathode.

The solar cell layer may include a semiconductor electrode, a electrolyte solution and an opposite electrode, the electrolyte solution being interposed between the semiconductor electrode and the opposite electrode.

The semiconductor electrode of the solar cell layer may be electrically coupled to the cathode of the OLED.

The solar cell formed on the solar cell layer may be a dye-sensitized solar cell.

The solar cell layer may be a film type solar cell.

The solar cell may include a semiconductor electrode including a mixture layer comprising a nano-particle oxide layer and an acetate or chloride layer including cations with a 1 or 2 oxidation state, and a dye molecule layer chemically absorbed by the mixture layer; an opposite electrode facing the semiconductor electrode; and an electrolyte solution interposed between the semiconductor electrode and opposite electrode.

The cations (A) with a 1 or 2 oxidation state may be one of $Zn^{2+}$, $Mg^{2+}$, $Cd^{2+}$, $Ni^{2+}$, $Ca^{2+}$, $Li^+$, $Na^+$, $Ag^+$ and $K^+$ The ratio (X=A/M) of the cations A contained in the acetate or chloride to metal catalyst ions M of the nano-particle oxide in the mixture layer may be in the range of $0 \leq X \leq 1$.

The nano-particle oxide may be one of $TiO_2$, $SnO_2$, and $Nb_2O_5$.

The nano-particle $TiO_2$ oxide may be one of anatase and rutile.

The semiconductor electrode may include the mixture layer coated on a conductive transparent substrate.

The electrolyte solution may be an electrolyte that dissolves 0.6 M 1,2-dimethyl-3-octyl-imidazolium iodide, 0.2M LiI, 0.04M $I_2$, and 0.2M TBP (4-tert-butylpyridine) in acetonitrile.

The substrate may have a thickness of 0.05~1 mm.

The substrate may be one of a glass substrate, a plastic substrate, a metal substrate, and a steel substrate.

The organic light emitting display may further include: a semiconductor formed on the substrate; a gate insulating film formed on the semiconductor layer; a gate electrode formed on the gate insulating film that corresponds to a channel region of the semiconductor layer; an interlayer insulating film formed on the gate electrode and gate insulating film; a source/drain electrode formed on the interlayer insulating film; an insulating film formed on the source/drain electrode and the interlayer insulating film; the Organic Light Emitting Diode (OLED) formed on the insulating film; and the solar cell layer formed on the OLED.

The solar cell layer may be electrically coupled to a power stabilization circuit, the power stabilization circuit including a switching and reverse current prevention circuit, a feedback control circuit, a voltage dividing circuit, a charging/discharging protection circuit and a charging battery.

An positive electrode of the solar cell layer may be electrically coupled to a positive electrode of the charging battery, and a negative electrode of the solar cell layer electrically coupled to an negative electrode of the charging battery.

The switching and reverse current prevention circuit may be electrically coupled between the positive electrode of the solar cell layer and the positive electrode of the charging battery.

The feedback control circuit may be electrically coupled in parallel between the solar cell layer and charging battery.

The switching and reverse current prevention circuit and the feedback control circuit may be electrically coupled in series with each other.

The feedback control circuit may be electrically coupled in parallel between the solar cell layer and charging battery.

The voltage dividing circuit may be electrically coupled in parallel between the solar cell layer and charging battery.

The charging/discharging protection circuit may be electrically coupled in parallel between the solar cell layer and charging battery.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention are described with reference to accompanying drawings.

Figure 2:
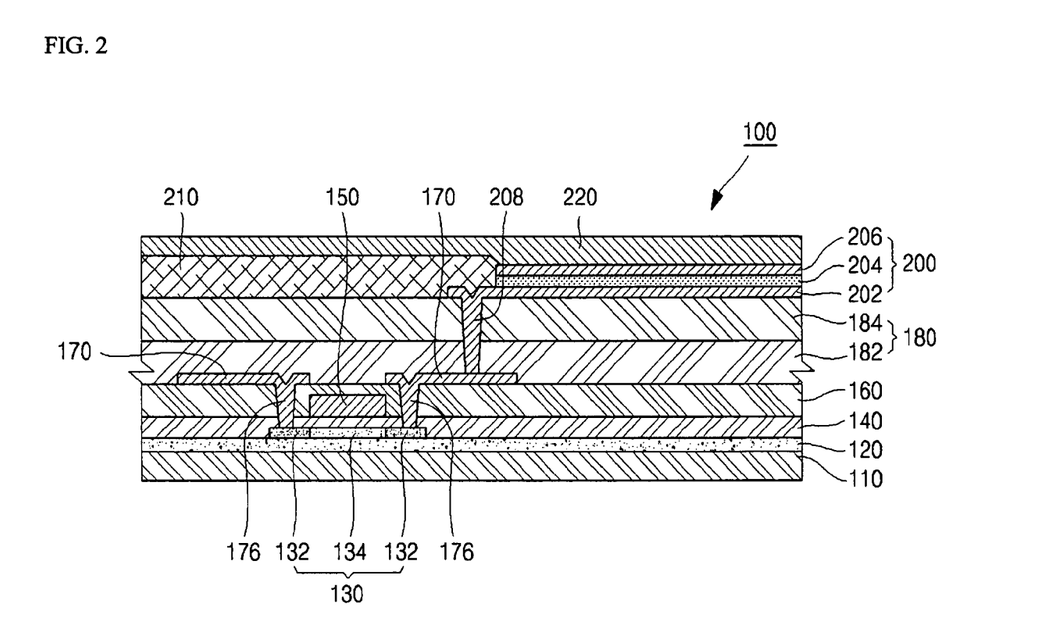
FIG. 2 is a cross-sectional view of an organic light emitting display according to an embodiment of the present invention.

FIG. 2 is a cross-sectional view of an organic light emitting display according to an embodiment of the present invention.

Referring to FIG. 2, an organic light emitting display 100 includes a substrate 110, a buffer layer 120 formed on the substrate 110, a semiconductor layer 130 formed on the buffer layer 120, a gate insulating film 140 formed on the semiconductor layer 130, a gate electrode 150 formed on the gate insulating film 140, an inter-layer insulating film 160 formed on the gate electrode 150, a source/drain electrode 170 formed on the inter-layer insulating film 160, an insulating film 180 formed on the source/drain electrode 170, an OLED 200 formed on the insulating film 180, a pixel definition layer 210 formed on the insulating film and a solar cell layer 220 formed on the OLED 200 and the pixel definition layer 210.

The substrate 110 is formed so that its upper surface and lower surface are parallel with each other and the thickness across both surfaces is on the order of 0.05~1 mm. When the thickness of the substrate 110 is 0.05 mm or less, the substrate 110 can be easily damaged and vulnerable to external forces during a washing process, an etching process, and a heat treatment process during fabrication. When the thickness of the substrate 110 is 1 mm or more, the substrate 110 is difficult to apply to recent portable devices which are being made thinner. The substrate 110 can be a glass substrate, a plastic substrate, a metal substrate, a polymer substrate, or an equivalent thereof. However, the present invention is not limited thereto.

The buffer layer 120 is formed on the upper surface of the substrate 110. This buffer layer 120 serves to prevent $H_2O$, $H_2$, or $O_2$ from penetrating the substrate 110 and thus entering the OLED 100. For this purpose, the buffer layer 120 may be at least one of a silicon oxide film $SiO_2$, a silicon nitride film $Si_3N_4$, an inorganic film or an equivalent thereof that can be easily acquired by a semiconductor process. However, the present invention is not limited thereto. Of course, the buffer layer 120 may be omitted depending upon the structure of the semiconductor layer.

The semiconductor layer 130 is formed on the upper surface of the buffer layer 120. The semiconductor layer 130 includes source/drain regions 132 that are formed to face each other, and a channel region 134 provided between the source/drain regions 132. The thin film transistor may be at least one of an amorphous Si thin film transistor, a polycrystalline Si thin film transistor, an organic thin film transistor, a micro Si thin film transistor (where, micro Si refers to silicon having mid-sized grains of amorphous Si and polycrystalline Si), or an equivalent thereof. However, the present invention is not limited thereto. When the thin film transistor is a polycrystalline Si thin film transistor, the polycrystalline Si thin film transistor may be crystallized by one of a low temperature laser, a metal catalyst, a high pressure, or an equivalent thereof. However, the present invention is not limited thereto. The crystallization method using a low temperature laser may include an Excimer Laser Annealing (ELA) method, a Sequential Lateral Solidification (SLS) method, or a Solid Phase Crystallization (SPC) method. However, the present invention is not limited thereto. The crystallization method using a metal catalyst may include a Metal Induced Crystallization (MIC) method, a Metal Induced Lateral Crystallization (MILC) method, or a Super Grained Silicon (SGS) method. However, the present invention is not limited thereto. Of course, the thin film transistor may include a P-type Metal Oxide Semiconductor (PMOS), an N-type Metal Oxide Semiconductor (NMOS), or an equivalent thereof. However, the present invention is not limited thereto.

The gate insulating film 140 is formed on the semiconductor layer 130. Of course, the gate insulating film 140 may also be formed on a part of the buffer layer 120 that is not covered by the semiconductor layer 130. The gate insulating film 140 may include a silicon oxide film, a silicon nitride film, an inorganic film, or an equivalent thereof that can be easily acquired by a semiconductor process. However, the present invention is not limited thereto.

The gate electrode 150 is formed on the upper surface of the gate insulating film 140. More specifically, the gate electrode 150 is formed on a part of the gate insulating film 140 that corresponds to the channel region 134 of the semiconductor layer 130. The gate electrode 150 supplies an electric field to the channel region 134 beneath the gate insulating film 140 so that holes or electrons can be generated in the channel region 134; A transistor having this structure is called a 'Field Effect Transistor', more specifically, a 'MOS-FET (Metal Oxide Silicon Field Effect Transistor)'. The gate electrode 150 may be formed of at least one of a metal catalyst (Mo, MoW, Ti, Cu, Al, AlNd, Cr, a Mo alloy, a Cu alloy, an Al alloy, etc.), doped-polycrystalline silicon, or an equivalent thereof. However, the present invention is not limited thereto.

The inter layer insulating film 160 is formed on the upper surface of the gate electrode 150 and gate insulating film 140. The inter layer insulating film 160 may be a silicon oxide film, a silicon nitride film, a polymer film, a plastic film, a glass film, or an equivalent thereof. However, the present invention is not limited thereto.

An etching process, which is called a contact hole process, is performed to contact the source/drain regions 132 with the semiconductor region on the inter layer insulating film 160. The region exposed by the contact hole process is generally called a contact hole in which a conductive contact 176 is formed.

Source/drain electrodes 170 are formed on the upper surface of the inter layer insulating film 160 by one of a Plasma Enhanced Chemical Vapor Deposition (PECVD) method, a Low Pressure Chemical Vapor Deposition (LPCVD) method, a sputtering method, or an equivalent thereof. Of course, a photoresist applying process, a light exposing process, a developing process, an etching process, and a photoresist peeling process are sequentially carried out to form the source/drain electrodes 170 at the desired locations. Conductive contacts 176 that penetrate the inter layer insulating film 160 are formed between the source/drain electrodes 170 and source/drain regions 132 of the semiconductor layer 130. Of course, the conductive contacts 176 are formed through the contact holes formed in advance as described above.

The semiconductor layer 130 and source/drain electrodes 170 are electrically connected to each other by the conductive contacts 176. These conductive contacts 176 may also be formed of the same material as the gate electrode 150 and source/drain electrodes 170. However, the present invention is not limited thereto.

The source/drain electrodes 170 are formed on the upper surface of the inter layer insulating film 160. Of course, the conductive contacts 176 that penetrate the inter layer insulating film 160 may be formed between the source/drain electrodes 170 and semiconductor layer 130. That is, the source/drain regions 132 of the semiconductor layer 130 and source/drain electrodes 170 are electrically connected to each other by the conductive contacts 176. These source/drain electrodes 170 may also be formed of the same material as the gate electrode 150. However, the present invention is not limited thereto. On the other hand, the semiconductor layer 130 (i.e. a thin film transistor) may be defined as a coplanar structure. However, the semiconductor layer 130 of the present invention is not limited to the coplanar structure but may include at least one of an inverted coplanar structure, a staggered structure, an inverted staggered structure, or an equivalent thereof. However, the present invention is not limited thereto.

The insulating film 180 is formed on the upper surface of the source/drain electrodes 170 and the inter layer insulating film 160. This insulating film 180 may include a protective film 182 and an overcoat 184 formed on the upper surface of the protective film 182. The protective film 182 covers the source/drain electrodes 170 and the inter layer insulating film 160 and serves to protect the source/drain electrodes 170 and the like. Parts of the protective film 182 and overcoat 184 that correspond to the source/drain electrodes 170 are etched in advance so that a via hole is formed. Then, a conductive via 208 is formed in the via hole. The conductive via 208 has a role in electrically connecting the anode 202 of the OLED 100 with the source/drain regions 132 of the semiconductor layer 130.

The protective film 182 may be formed of a general inorganic film or an equivalent thereof. However, the present invention is not limited thereto. The overcoat 184 is formed on the protective film 182. The overcoat 184, which prevents the OLED and the cathode electrode from being short circuited or disconnected due to level differences, may be formed of at least one of Benzo Cyclo Butene (BCB), an acrylic, or an equivalent thereof. However, the present invention is not limited thereto.

The OLED 200 is formed adjacent to the outer circumference of the pixel definition layer 210. The OLED 200 may include an anode 202, an organic light emitting thin film 204 formed on the upper surface of the anode 202, and a cathode 206 formed on the upper surface of the organic light emitting thin film 204. The anode 202 may be formed of at least one of Indium Tin Oxide (ITO), ITO/Ag, ITO/Ag/ITO, ITO/Ag/Indium Zinc Oxide (IZO), ITO/Ag alloy/ITO (ATD) or an equivalent thereof. However, the present invention is not limited thereto. The ITO film is a transparent conductive film that has an even work function and thus provides a small injection barrier relative to the organic light emitting thin film 204, and the Ag film is a reflective film that reflects light from the organic light emitting thin film 204 to the upper surface, especially in a front surface emission type OLED. On the other hand, the organic light emitting thin film 204 may include an EMitting Layer (EML) for generating excitons with the combination of holes and electrons to emit light, an Electron Transport Layer (ETL) for appropriately adjusting moving speed of electrons, and a Hole Transport Layer (HTL) for appropriately adjusting moving speed of holes. In addition, the ETL may be further provided with an Electron Injecting Layer (EIL) for improving injection efficiency of electrons and the HTL may be further provided with a Hole Injecting Layer (HIL) for improving injection efficiency of holes. The cathode 206 may be formed of at least one of Al, a MgAg alloy, a MgCa alloy, or an equivalent thereof. However, the present invention is not limited thereto. For a front surface emission type OLED, the Al should be made very thin, which causes its electrical resistance to increase, so that the electron injection barrier becomes large. The MgAg alloy has smaller electron injection barrier than Al, and the MgCa alloy has smaller injection barrier than the MgAg alloy. For a front surface emission type OLED, therefore, it is preferable to employ a MgAg alloy or MgCa alloy rather than Al for the cathode 206. However, since these MgAg alloy and MgCa alloy are sensitive to the environment and may be easily oxidized, they need to be completely protected from the external environment.

While the present invention has been described in terms of a front surface emission type OLED that directs light from the substrate 110 upwardly, it should be understood that the present invention is not limited thereto but also applicable to a rear surface emission type OLED that directs light from the substrate 110 downwardly or a both surface emission type OLED that directs light from the substrate 110 both upwardly and downwardly.

The pixel definition layer 210 is formed adjacent to the outer circumference of the OLED 100 and on the upper surface of the insulating film 180. This pixel definition layer 210 surely defines a boundary between a red OLED, a green OLED, and a blue OLED to make clear the emission boundary region between pixels. The pixel definition layer 210 may be formed of at least one of polyimide or an equivalent thereof. However, the present invention is not limited thereto.

The solar cell layer 220 is formed on the upper surface of the pixel definition layer 210 and OLED 200. In principal, an organic light emitting display is a self-luminescent display, and therefore does not require a polarizing film. However, a polarizing film may be used as the solar cell layer 220 to eliminate external light that affects the self-emission image quality by reflection. Light radiating from an organic light emitting display has probably the same vibration direction without respect to its advancing direction. A polarizing film may transmit only light that vibrates in the same direction as the polarizing axis and absorbs and/or reflects using an appropriate medium the other light that vibrates in different direction from the polarizing axis in order to provide only light of a specific vibration direction.

The polarizing film should include basic properties such as high polarization efficiency, high transmittance, excellent appearance properties and durability, easy-to-process, easy-to-use, etc.

Figure 8:
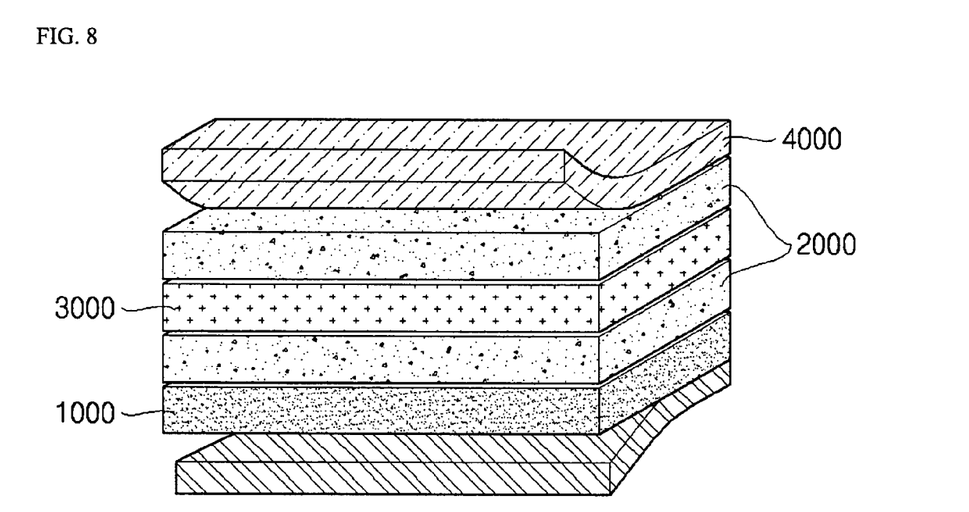
FIG. 8 is a schematic view of a basic structure of a polarizing film.

FIG. 8 schematically shows a basic structure of a polarizing film.

Referring to FIG. 8, the polarizing film generally includes an adhesive 1000 for adhering the polarizing film to the upper surface of a display, a first protective layer 2000 on the upper surface of the adhesive, a polarizer 3000 on the upper surface of the first protective layer 2000, a second protective layer 2000 on the upper surface of the polarizer 3000, and a protective film 4000 on the second protective layer 2000.

This polarizing film may be an iodine-based polarizing film, a dye-based polarizing film, a phase-difference polarizing film, a transflective polarizing film, a high-reflection transflective polarizing film, an anti-surface reflection polarizing film (AG/AR), a reflective polarizing film, or the like.

The iodine-based polarizing film is a high-definition polarizing film with a high transmittance and high polarization, and uses iodine with high dichroism in order to endow a transparent PVA film with the absorbing capacity of light in the range of visible rays. Currently, most of the polarizing films for LCDs are iodine-based polarizing films.

The dye-based polarizing film is a high-durability polarizing film that has a low variation in optical properties even at high temperatures and high humidity conditions. The dye-based polarizing film has been used for displays requiring high durability because of their advantage in terms of durability. In addition, the dye-based polarizing film can be used for polarizing films having various colors because of its relatively easy color adjustment.

The phase-difference polarizing film is mainly used for Super Twisted Nematic LCDs (STN-LCDs), and can be manufactured variously according to both properties of a phase-difference film to be used for the phase-difference polarizing film and angles with which the phase-difference film is applied to the phase-difference polarizing film. The phase-difference polarizing film can compensate for phase differences occurring at a liquid crystal and currently uses PolyCarbonate (PC) phase-difference film as its main material.

The transflective polarizing film has both transparent properties and reflective properties. One of most important factors of the display for a portable device is the consumption of power; if a portable device consumes more power, then its battery life becomes shorter, and thus existing transmission types that have high power consumption are replaced by transflective displays that exploit external light for display. The transflective polarizing film is used for the lower substrate of such transflective displays.

The high-reflection transflective polarizing film employs metal catalyst deposition films and diffusion adhesives instead of existing transflective polarizing films using pigments in order to reduce power consumption and make its appearance look simple. The metal catalyst deposition films serve to raise reflectivity and the diffusion adhesives serve to make its appearance look simpler and cleaner.

The anti-surface reflectivity process for the anti-surface reflection polarizing film (AG/AR) can be classified into two type; one is an Anti-Glare (AG) process, and the other is an Anti-Reflection (AR) process. The AG process can acquire an anti-reflection effect by forming an uneven surface on the surface of a film to cause diffused reflection of external light, and the AR process can acquire an anti-reflection effect by forming multiple-layered thin films on the surface of a film by a deposition method or coating method. In general, the reflectivity of a polarizing film not processed by a anti-reflectivity process is approximately 4%, but the reflectivity of an AG film and AR film, respectively, is approximately 2% and less than 1%.

The reflective polarizing film is made by attaching a transparent film (iodine-based polarizing film) to a metal catalyst deposition reflective film, and this is primarily used for reflective LCDs.

The solar cell to be used for the solar cell layer 220 of the organic light emitting display 100 according to the present invention is a dye-sensitized solar cell having semiconductor electrodes of nano-particle oxides.

Figure 3:
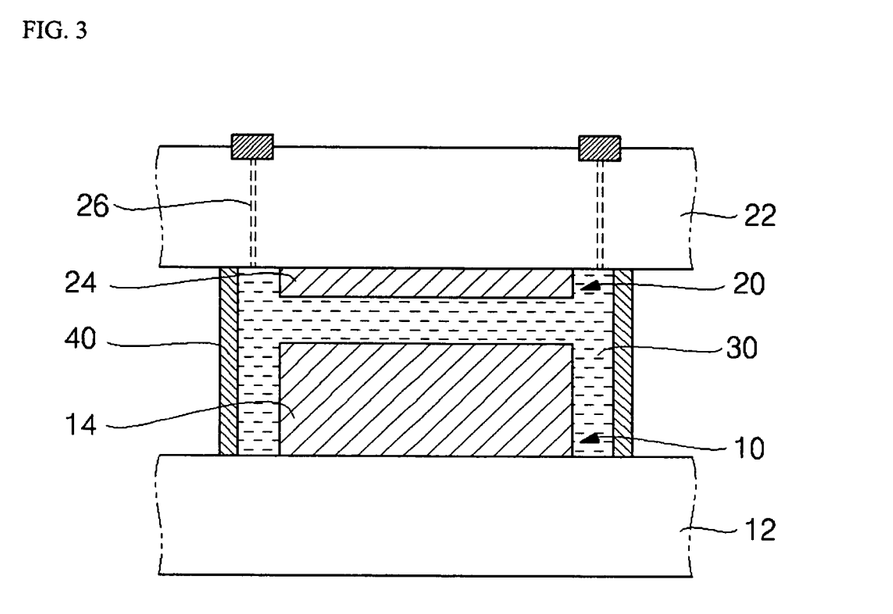
FIG. 3 is a schematic view of the construction of a dye-sensitized solar cell.

FIG. 3 is a view of the construction of a dye-sensitized solar cell.

Referring to FIG. 3, the dye-sensitized solar cell includes a semiconductor electrode (negative electrode) 10, an opposite electrode (positive electrode) 20, and an electrolyte solution 30 between the semiconductor electrode 10 and opposite electrode 20. The semiconductor electrode (negative electrode) 10 consists of a conductive glass substrate 12, e.g. a conductive glass substrate coated with Indium Tin Oxide (ITO) or $SnO_2$, and a mixture layer 14 applied on the conductive glass substrate 12, wherein the mixture layer 14 is formed of a nano-particle oxide and an acetate or chloride including cations ($A=Zn^{2+}$, $Mg^{2+}$, $Cd^{2+}$, $Ni^{2+}$, $Ca^{2+}$, $Li^+$, $Na^+$, $Ag^+$, or $K^+$) with 1 or 2 oxidation states. The nano-particle oxide constituting the mixture layer 14 has a nano size of approximately 5-30 nm, and is composed of $TiO_2$, $SnO_2$, and $Nb_2O_5$. The nano-particle oxide may include anatase-$TiO_2$ or rutile- $TiO_2$. The ratio (X=A/M) of the cations A with 1 or 2 oxidation state constituting the mixture layer 14 to the metal catalyst ions M may be in the range of $0 \leq X \leq 1$. In addition, the mixture layer 14 may have a thickness of approximately 1~15 μm. A ruthenium based dye molecule layer is chemically absorbed on the mixture layer 14.

The opposite electrode (positive electrode) 20 consists of a conductive glass substrate 22, e.g. a conductive glass substrate coated with ITO or $SnO_2$, and a platinum layer 24 applied on the conductive glass substrate 22. The platinum layer 24 of the opposite electrode (positive electrode) 20 is arranged to face the mixture layer 14 of the semiconductor layer 10. The electrolyte solution 30 filled between the semiconductor electrode (negative electrode) 10 and opposite electrode (positive electrode) 20 may include an $I_3^-/I^-$ electrolyte solution including 0.6 M 1,2-dimethyl-3-octyl-imidazolium iodide), 0.2M LiI, 0.04M $I_2$, and 0.2M TBP (4-tert-butylpyridine) dissolved in acetonitrile. In addition, a polymer layer 40 that has the thickness of approximately 30~50 μm is further provided between the positive electrode and negative electrode. A micro hole 26 formed in the positive electrode serves to fill the electrolyte solution 30 in the space between both electrodes. If the space is completely filled with the electrolyte solution 30, the micro hole 26 is clogged.

The dye-sensitized solar cell has been developed to have lower costs and high grade energy efficiency using inexpensive organic dyes and nano-technology. The dye-sensitized solar cell is applicable to the surface of a display in the form of a film since it can transmit visible rays.

When the dye-sensitized solar cell uses an organic dye having a polarizing property, it can replace the polarizing film used in organic light emitting displays and the like.

Figure 4:
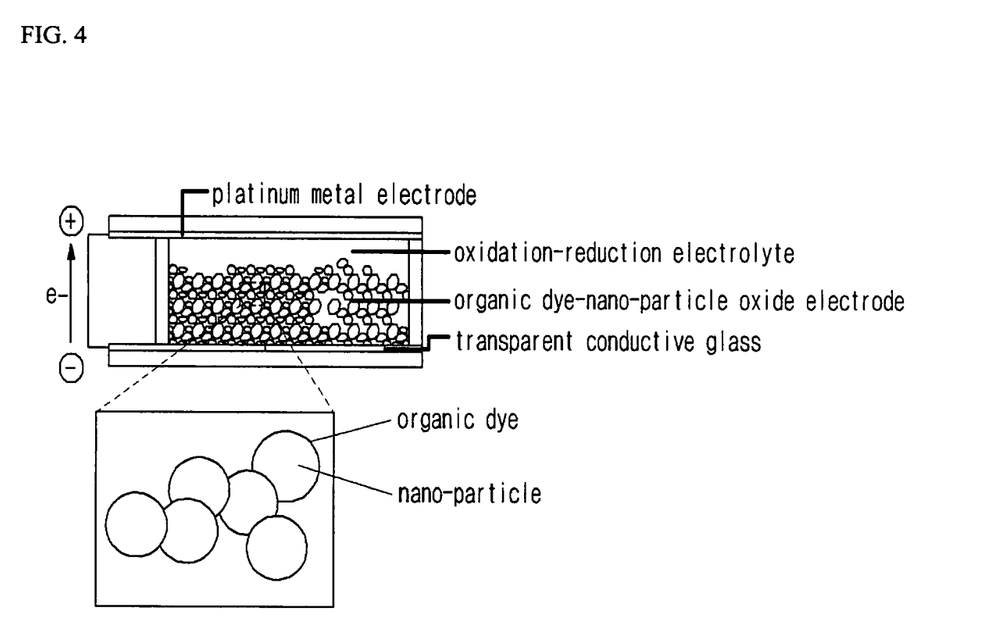
FIG. 4 is a schematic view of a dye-sensitized solar cell using a nano-particle oxide.

FIG. 4 is a schematic view of a dye-sensitized solar cell using a nano-particle oxide.

Referring to FIG. 4, a platinum metal catalyst electrode 24 forms the positive electrode (positive electrode) and a transparent conductive glass electrode 12 forms the negative electrode (negative electrode). An oxidation-reduction electrolyte material 30 and an organic dye are filled between the positive electrode and negative electrode. The mixture layer 14 of the semiconductor electrode 10 are formed on glass substrate 12, and the organic dye may be chemically absorbed on the mixture layer.

Figure 5:
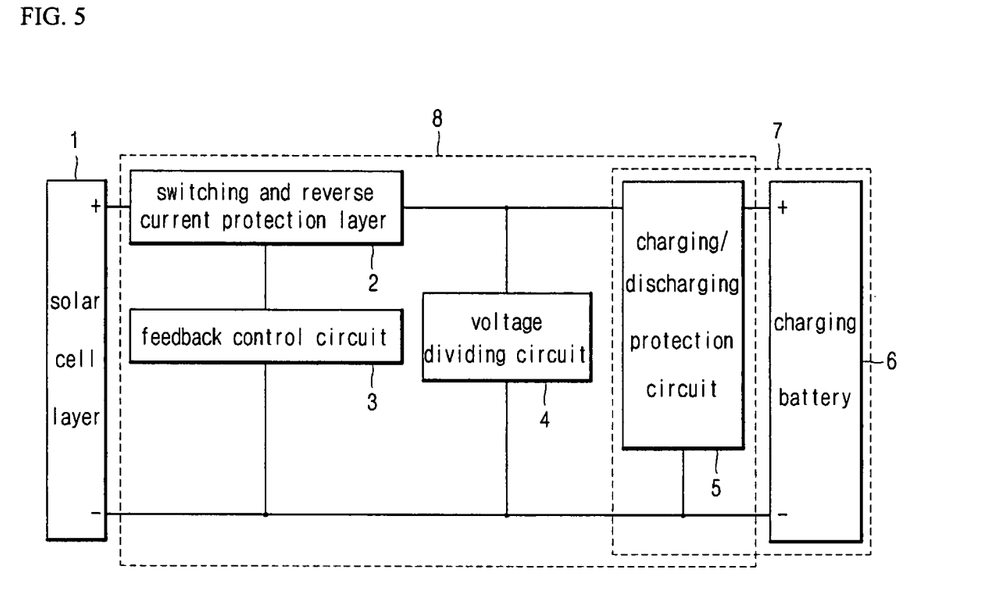
FIG. 5 is a block diagram of a power supply using a solar cell according to an embodiment of the present invention.

FIG. 5 is a block diagram of a power supply using a solar cell in accordance with an embodiment of the present invention.

Figure 9:
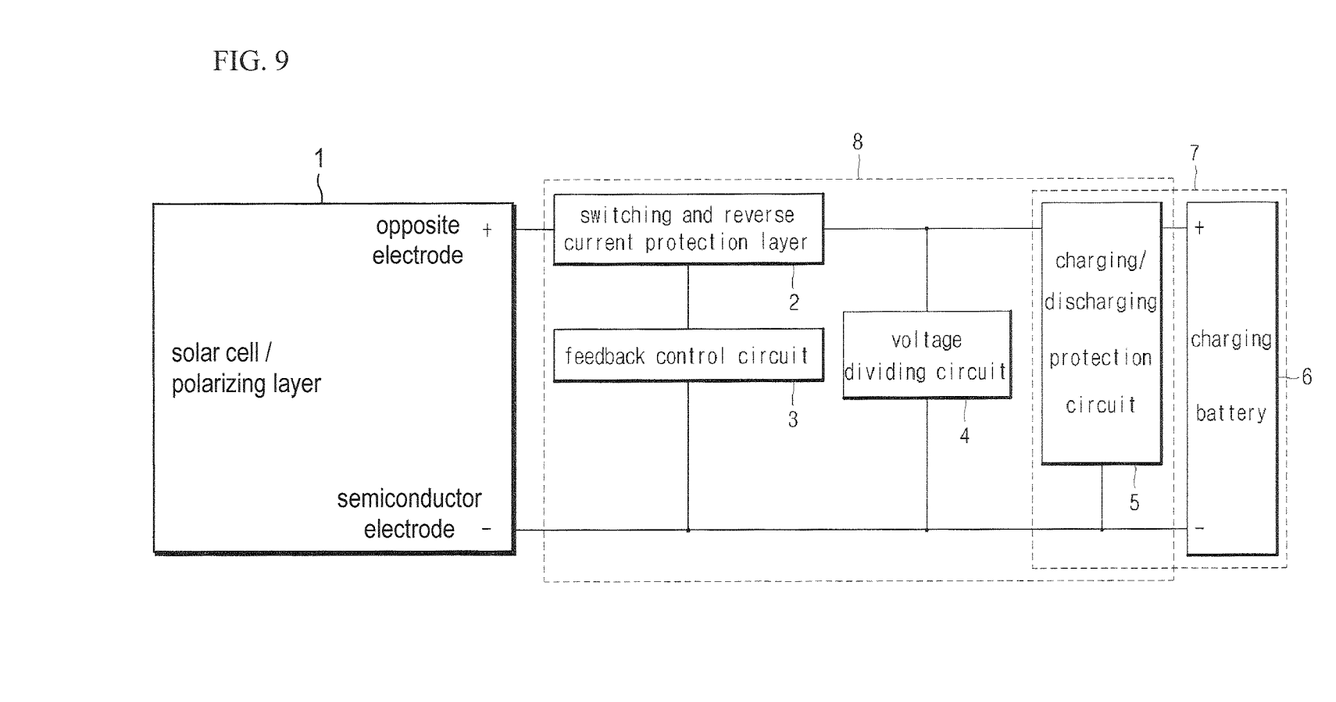
FIG. 9 is a block diagram of a power supply using a solar cell or a polarizing layer according to another embodiment of the present invention.

Referring to FIG. 5, the solar cell layer 1 includes a number of solar cells as its unit cell that transforms light energy to electrical energy. The switching and reverse current prevention circuit 2 serves to switch on/off the power output of the solar cell layer 1 and prevent a reverse current from occurring. The feedback control circuit 3 compares a reference voltage with a feedback voltage and controls the switching interval of the switching and reverse current prevention circuit 2 based on the comparison results. The voltage dividing circuit 4 distributes the output voltage of the feedback control circuit 3 and returns the distributed output voltage to the feedback control circuit 3. The charging/discharging protection circuit 5 measures the voltage of the unit cells, and cuts off the voltage inputted to the charging battery when the measured unit cell voltage is in excess of a maximum reference voltage and the discharge power source when the measured unit cell voltage is less than a minimum reference voltage. The switching and reverse current prevention circuit 2, feedback control circuit 3, voltage dividing circuit 4, and charging/discharging protection circuit 5 stabilize the power source so that the charging battery 6 has a power source within the reference voltage and reference current from the solar cell layer 1. Referring to FIG. 9, in another embodiment, the solar cell layer or polarizing layer 1 may be electrically connected to the power stabilization circuit 8.

Hereinafter, the operation of the power supply using a dye-sensitized solar cell in 17 accordance with an embodiment of the present invention is explained with reference to FIG. 5.

If the solar cell layer 1 is illuminated by the sunlight or light from a halogen lamp, then the unit cells of the solar cell layer 1 transform light energy into electrical energy which in turn is applied to the switching and reverse current prevention circuit 2.

Figure 6:
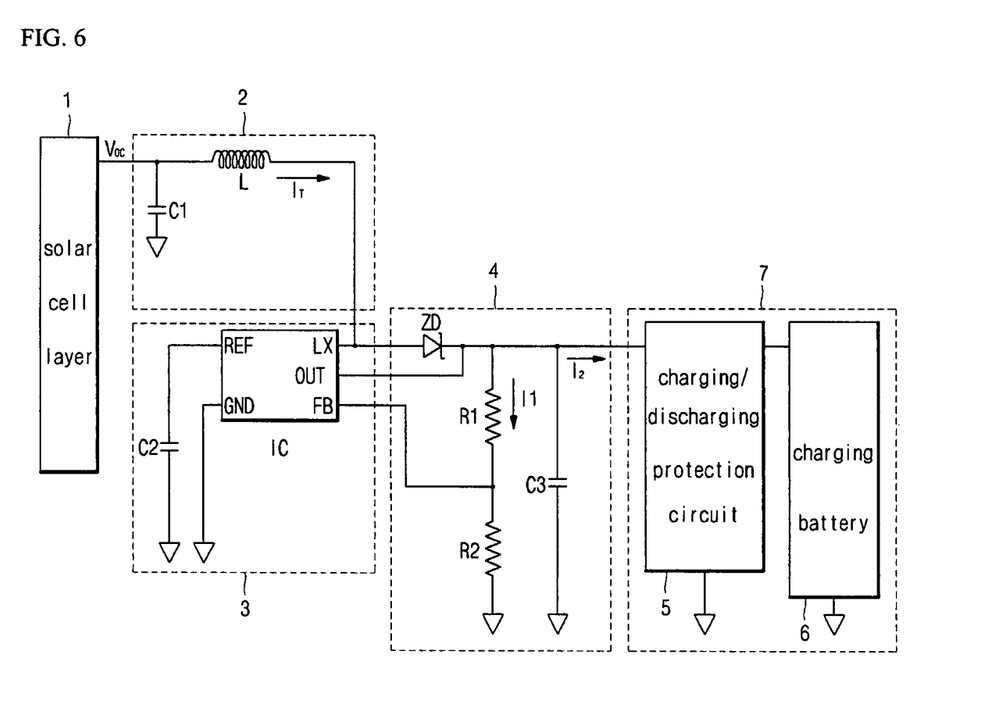
FIG. 6 is a detailed circuit diagram of a power supply using a solar cell according to an embodiment of the present invention.

Referring to FIGS. 5 and 6, a current $I_T$ is equal to the sum of a current $I_1$ and a current $I_2$, where the voltage supplied from the solar cell layer 1 to the switching and reverse current prevention circuit 2 represents $V_{OC}$; the current $I_T$ is a current flowing across an inductor L of the switching and reverse protection circuit 2 due to the voltage $V_{OC}$; the current $I_1$ is a current flowing across resistors R1 and R2 of the voltage dividing circuit 4; and the current $I_2$ is a current supplied to the charging/discharging protection circuit 5 of the battery section 7; and the current $I_1$ is equal to the sum of the voltages VR1 and VR2 divided by the sum of resistors R1 and R2, when the voltages VR1 and VR2 are voltages respectively supplied across the resistors R1 and R2. As a consequence, the current $I_2$ supplied to the charging/discharging protection circuit 5 is adjusted by detecting the voltage VR2 across the resistor R2.

That is, the direct voltage $V_{OC}$ supplied from the solar cell layer 1 to the switching and reverse current prevention circuit 2 is stabilized by the switching operation of the switching and reverse current prevention circuit 2 and supplied to the charging/discharging protection circuit 5 through the feedback control circuit 3. The voltage VR2 across the resistor R2 of the voltage dividing circuit 4 is detected and returned to the feedback terminal FB of an IC of the feedback control circuit 3. Then, the returned voltage is compared with a reference voltage of the IC.

Therefore, it is possible for the charging/discharging protection circuit 5 to supply the charging battery 6 with stable voltage required for the charging battery 6 by setting as the reference voltage the charging voltage for the charging battery 6 required by the charging/discharging protection circuit 5. This operation can control the switching interval of the switching and reverse current prevention circuit 2 based on the difference between the detected voltage VP2 and the reference voltage compared at the feedback control circuit 3, thus making it possible to reduce the voltage difference between the reference voltage and the detected voltage VR2 across the resistor R2, i.e. the voltage supplied to the charging/discharging protection circuit 5.

As such, the present invention can adjust the charging voltage of the charging battery 6 supplied to the charging/discharging protection circuit 5 by adjusting the reference voltage of the IC located in the feedback control circuit 3, and obtain further stabilized direct voltage as the voltage supplied to the charging/discharging protection circuit 5 for charging the charging battery 6 by detecting the voltage VR2 across the resistor R2 and returning the voltage VR2 to the feedback terminal FB of the IC located in the feedback control circuit 3.

The charging/discharging protection circuit 5 is provided to protect the charging battery 6 from over-charging or over-discharging; when the charging battery 6 is supplied with a charging voltage per unit cell that exceeds 4.5V, the electrolyte is dissolved to emit gases or pressurize the safety valve, so that pressure among the unit cells can be raised or electrolyte can escape from the cells. This may give rise to an explosion of the circuit. On the contrary, when the charging battery 6 is over-discharged, the negative electrode can be damaged, so that the performance of the charging battery 6 may deteriorate. Accordingly, the charging/discharging protection circuit 5 is used to prevent the above risks of the charging battery 6. More specifically, the charging/discharging protection circuit 5 can be operated as follows:

Over-Charging Prevention: when the unit cell voltage of the charging battery 6 is more than 4.35V±0.05V, the charging/discharging protection circuit 5 cuts off an input voltage to prevent the charging battery 6 from being over-charged.

Over-Discharging Prevention: when the unit cell voltage of the charging battery 6 is less than 2.3V±0.15V, the charging/discharging protection circuit 5 cuts off the input voltage to prevent the charging battery 6 from being over-discharged.

The present invention includes a solar cell layer 1 for generating a voltage of ranging 4.3V~4.98V, and a power stabilization circuit 8 including a switching and reverse current prevention circuit 2, a feedback control circuit 3, a voltage dividing circuit 4, and a charging/discharging protection circuit 5.

On the other hand, the solar cell layer 1 and power stabilization circuit 8 can be formed in a single module and electrically coupled to the organic light emitting display.

Figure 7:
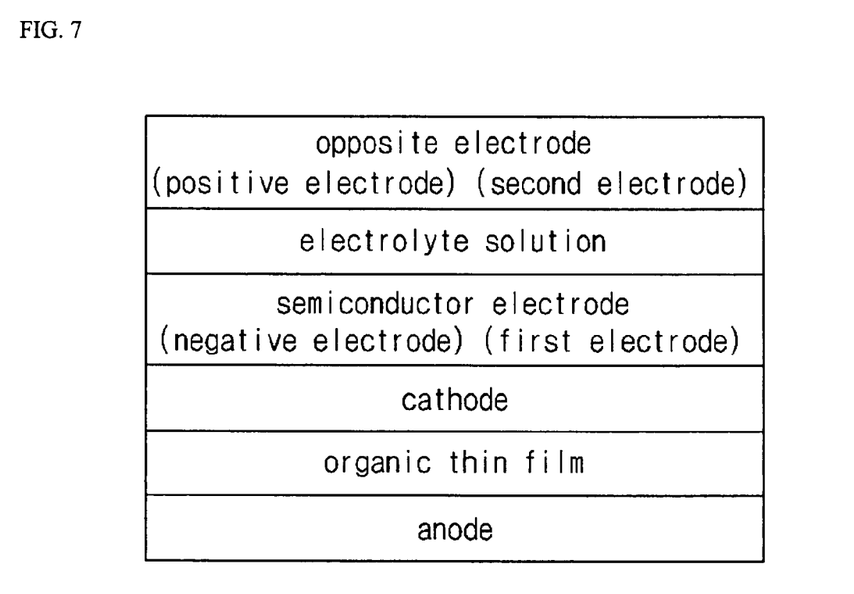
FIG. 7 is a schematic view of the construction of a dye-sensitized solar cell formed on an OLED.

FIG. 7 is a schematic view of the construction of a dye-sensitized solar cell formed on an OLED.

Referring to FIG. 7, an electrical interaction of a power supply using the polarizing layer of the organic light emitting display, the OLED and the solar cell is explained as follows. The OLED includes an anode, an organic thin film, and a cathode in the order from bottom to top. The cathode is electrically coupled to the semiconductor electrode (negative electrode) of the polarizing layer. An oxidation-reduction electrolyte solution is on the upper surface of the semiconductor electrode (negative electrode), and an opposite electrode (positive electrode) is formed on the upper surface of the oxidation-reduction electrolyte solution. The semiconductor electrode (negative electrode) and opposite electrode (positive electrode) are electrically coupled to the positive electrode and negative electrode of the power supply using a solar cell in accordance with an embodiment of the present invention, which in turn is electrically coupled to the charging battery 6 for charging the generating power.

The explanation above was for an Active Matrix Organic Light Emitting Display (AMOLED). However, an organic light emitting display in accordance with an embodiment of the present invention is not only limited to an AMOLED but can also be applied to a Passive Matrix Organic Light Emitting Display (PMOLED).

As described above, an organic light emitting display in accordance with an embodiment of the present invention can not only display images but also generate power by employing a dye-sensitized solar cell as the polarizing film of the organic light emitting display, the dye-sensitized solar cell having been developed to have a reasonable price and high energy efficiency using inexpensive organic dyes and nanotechnology.

For this purpose, the dye-sensitized solar cell is supplied to the polarizing layer of the organic light emitting display in order to generate power, so that the generated power may be used as an energy source for charging the battery for a portable device and thus prolong the battery life of the portable device.

Furthermore, the dye-sensitized solar cell can eliminate external light that affects the self-emission image quality by reflection since it can serve as the polarizing film of the OLED. As a consequence, the organic light emitting display employing the dye-sensitized solar cell as its polarizing film provides a high polarizing efficiency, thereby improving the self-emission image quality, generating power, and prolonging the battery life of a portable device, such as a laptop computer, a cellphone, a PDA, etc. using an organic light emitting display.

It should be understood by those of ordinary skill in the art that various replacements, modifications and changes in the form and details may be made therein without departing from the spirit and scope of the present invention as defined by the following claims. Therefore, it is to be appreciated that the above described embodiments are for illustration purposes only and are not to be construed as being limitations of the invention.

What is claimed is:

1. An organic light emitting display device, comprising:
   a substrate;
   an Organic Light Emitting Diode (OLED) including an anode arranged on an upper surface of the substrate, an organic thin film arranged on an upper surface of the anode, and a cathode arranged on an upper surface of the organic thin film; and
   a solar cell layer comprising a solar cell arranged on an upper surface of the cathode of the OLED, the solar cell comprising a semiconductor electrode which is contiguous with the cathode of the OLED, and a second electrode disposed opposite to and spaced apart from the semiconductor electrode, the solar cell layer formed of a polarizing film exclusively transmitting light that vibrates along the same direction as a polarizing axis of the polarizing film, the solar cell layer being electrically coupled to a power stabilization circuit, the power stabilization circuit comprising a switching/reverse current prevention circuit, a feedback control circuit, a voltage dividing circuit, a charging/discharging protection circuit and a charging battery, wherein the solar cell layer further comprises an electrolyte solution and an organic dye having polarizing properties, wherein each of the electrolyte solution and the organic dye being arranged between the semiconductor electrode and the second electrode.

2. The organic light emitting display device of claim 1, wherein the semiconductor electrode of the solar cell layer is coupled to the cathode of the OLED.

3. The organic light emitting display device of claim 1, wherein the solar cell comprises a dye-sensitized solar cell.

4. The organic light emitting display device of claim 3, wherein the semiconductor electrode comprises a mixture layer including a nano-particle oxide and either an acetate or chloride including cations A with either a 1 or 2 oxidation state, wherein the solar cell further comprises:
   an organic dye having polarizing properties interposed between the semiconductor electrode and second electrode; and
   an electrolyte solution interposed between the semiconductor electrode and second electrode.

5. The organic light emitting display device of claim 4, wherein the cations A comprise an ion selected from a group consisting of $Zn^{2+}$, $Mg^{2+}$, $Cd^{2+}$, $Ni^{2+}$, $Ca^{2+}$, $Li^{2+}$, $Na^{2+}$, $Ag^{2+}$, and $K^{2+}$.

6. The organic light emitting display device of claim 4, wherein a ratio (X=A/M) of the cations A contained in the acetate or chloride to metal catalyst ions M of the nano-particle oxide in the mixture layer is in a range of $0 \leq X \leq 1$.

7. The organic light emitting display device of claim 4, wherein the nano-particle oxide is one of $TiO_2$, $SnO_2$, and $Nb_2O_5$.

8. The organic light emitting display device of claim 7, wherein the nano-particle $TiO_2$ is of a form selected from a group consisting of anatase and rutile.

9. The organic light emitting display device of claim 4, wherein the semiconductor electrode comprises the mixture layer coated on a conductive transparent substrate.

10. The organic light emitting display device of claim 4, wherein the electrolyte solution comprises 0.6 M 1,2-dimethyl-3-octyl-imidazolium iodide, 0.2 M LiI, 0.04M $I_2$, and 0.2 M TBP (4-tert-butylpyridine) in acetonitrile.

11. The organic light emitting display device of claim 1, wherein the substrate has a thickness in a range of 0.05~1 mm and is comprised of a material selected from a group consisting of glass, plastic, metal, and steel.

12. The organic light emitting display device of claim 1, further comprising:
the semiconductor layer arranged on the substrate;
a gate insulating film arranged on the semiconductor layer;
a gate electrode arranged on the gate insulating film corresponding to a channel region of the semiconductor layer;
an interlayer insulating film arranged on the gate electrode and gate insulating film;
a source/drain electrode arranged on the interlayer insulating film;
an insulating film arranged on the source/drain electrode and the interlayer insulating film;
the OLED arranged on the insulating film; and
the solar cell layer arranged on the OLED.

13. The organic light emitting display device of claim 1, wherein second electrode of the solar cell layer is electrically coupled to a positive electrode of a charging battery, and the semiconductor electrode of the solar cell layer is electrically coupled to a negative electrode of the charging battery.

14. The organic light emitting display device of claim 1, wherein the switching/reverse current prevention circuit is electrically coupled between a positive electrode of the solar cell layer and a positive electrode of the charging battery.

15. The organic light emitting display device of claim 1, wherein the feedback control circuit is electrically coupled in parallel between the solar cell layer and the charging battery.

16. The organic light emitting display device of claim 1, wherein the switching/reverse current prevention circuit is electrically coupled in series with the feedback control circuit.

17. The organic light emitting display device of claim 1, wherein the organic thin film is arranged directly on the upper surface of the anode, the cathode is arranged directly on the upper surface of the organic thin film and the solar cell layer is arranged directly on the upper surface of the cathode of the OLED, the cathode of the OLED being arranged further from the substrate than the anode of the OLED.

18. The organic light emitting display device of claim 1, the OLED being a front surface emission type OLED that directs light from the substrate upwardly towards the solar cell layer, the solar cell comprised of the polarizing film to eliminate reflected external light that would otherwise affect the image quality of the OLED.

19. An organic light emitting display device, comprising:
a substrate;
an Organic Light Emitting Diode (OLED) including an anode arranged on an upper surface of the substrate, an organic thin film arranged on an upper surface of the anode, and a cathode arranged on an upper surface of the organic thin film; and
a solar cell layer comprising a solar cell arranged on an upper surface of the cathode of the OLED, the anode, the organic thin film, the cathode and the solar cell being arranged progressively further from the first substrate, the solar cell comprising a semiconductor electrode which is contiguous with the cathode of the OLED, and a second electrode disposed opposite to and spaced apart from the semiconductor electrode, the solar cell layer formed of a polarizing film exclusively transmitting light that vibrates along the same direction as a polarizing axis of the polarizing film.

20. The organic light emitting display device of claim 19, wherein the solar cell layer further comprises:
an electrolyte solution; and
an organic dye having polarizing properties, wherein each of the electrolyte solution and the organic dye being arranged between the semiconductor electrode and the second electrode.

21. The organic light emitting display device of claim 20, wherein the semiconductor electrode comprises a mixture layer including a nano-particle oxide and either an acetate or chloride including cations A with either a 1 or 2 oxidation state, wherein the solar cell further comprises:
an organic dye having polarizing properties interposed between the semiconductor electrode and second electrode; and
an electrolyte solution interposed between the semiconductor electrode and second electrode.

* * * * *